(12) United States Patent
Ijima

(10) Patent No.: US 7,873,086 B2
(45) Date of Patent: Jan. 18, 2011

(54) SEMICONDUCTOR DEVICE

(75) Inventor: Shin-ichi Ijima, Osaka (JP)

(73) Assignee: Panasonic Corporation, Osaka (JP)

( * ) Notice: Subject to any disclaimer, the term of this patent is extended or adjusted under 35 U.S.C. 154(b) by 34 days.

(21) Appl. No.: 12/337,681

(22) Filed: Dec. 18, 2008

(65) Prior Publication Data
US 2009/0185591 A1    Jul. 23, 2009

(30) Foreign Application Priority Data

Jan. 23, 2008    (JP)    ............................. 2008-012078
Aug. 6, 2008    (JP)    ............................. 2008-202485

(51) Int. Cl.
*H01S 3/04*    (2006.01)
*H01S 5/00*    (2006.01)
(52) U.S. Cl. ..................... 372/36; 372/34; 372/50.121
(58) Field of Classification Search .................. 372/34, 372/36, 50.121
See application file for complete search history.

(56) References Cited

U.S. PATENT DOCUMENTS

| | | | |
|---|---|---|---|
| 5,068,866 A * | 11/1991 | Wada et al. | .................... 372/36 |
| 6,188,132 B1 | 2/2001 | Shih et al. | .................... 257/724 |
| 7,075,178 B2 | 7/2006 | Yamamoto | .................... 257/687 |
| 2003/0231672 A1 * | 12/2003 | Komoto | ........................ 372/36 |
| 2005/0074043 A1 * | 4/2005 | Yamamoto | .................... 372/43 |
| 2005/0082550 A1 * | 4/2005 | Hamaoka et al. | .............. 257/80 |
| 2007/0063212 A1 * | 3/2007 | Watanabe et al. | ............. 257/99 |

FOREIGN PATENT DOCUMENTS

JP    2007-12979    5/2007

* cited by examiner

*Primary Examiner*—Minsun Harvey
*Assistant Examiner*—Phillip Nguyen
(74) *Attorney, Agent, or Firm*—Steptoe & Johnson LLP

(57) ABSTRACT

In a semiconductor device where a semiconductor element having an asymmetric temperature distribution during an operation is mounted, inner leads on the right and left ends have asymmetric lengths, so that the right and left regions of a semiconductor element mounting part have different sizes. The semiconductor element is mounted so as to have a high-temperature region side in a wide region of the mounting part, and the inner leads are wire bonded at the center to the wide region of the mounting part. It is thus possible to provide a small semiconductor device in which a long semiconductor element is mounted with heat dissipation.

9 Claims, 3 Drawing Sheets

SEMICONDUCTOR DEVICE

FIELD OF THE INVENTION

The present invention relates to a semiconductor device having a semiconductor element mounted on a mounting substrate.

BACKGROUND OF THE INVENTION

For installation into thin equipment such as a notebook computer, thin apparatuses have been demanded in optical recording/reproducing apparatuses. Thus semiconductor laser apparatuses having high heat dissipation with thin configurations have been demanded for installation into optical recording/reproducing apparatuses.

Referring to FIGS. 3A and 3B, the configuration of a semiconductor laser apparatus of the prior art will be described below.

FIGS. 3A and 3B are schematic diagrams showing the semiconductor laser apparatus of the prior art.

The semiconductor laser apparatus of the prior art is a semiconductor laser apparatus of a resin molded package. Leads 703 of a frame 101 have a height H3 relative to a semiconductor laser element mounting part 701, and mold resin 103 does not protrude from the underside of the frame. Since the underside of the package does not protrude, external heat dissipating components can be easily attached and heat can be easily dissipated.

However, as optical information recording/reproducing apparatuses have achieved high-speed recording in recent years, higher powers have been demanded of semiconductor laser apparatuses. Thus semiconductor laser elements mounted in semiconductor laser apparatuses have been increased in cavity length in response to higher powers. A dual-wavelength monolithic semiconductor laser element has a pulse light output of 400 mW to 500 mW and a cavity length of at least 2.0 mm. The long cavity length increases the length of the semiconductor laser element, so that a semiconductor laser apparatus in which the semiconductor laser element is mounted is also increased in size.

DISCLOSURE OF THE INVENTION

In view of this problem, an object of the present invention is to provide a small semiconductor device in which a long semiconductor element such as a high-power semiconductor laser element having a long cavity length is mounted with heat dissipation.

In order to attain the object, a semiconductor device of the present invention includes a semiconductor element and a lead frame, the lead frame including a mounting part for mounting the semiconductor element, a first lead connected to the mounting part, a second lead adjacent to the first lead, and a third lead adjacent to the second lead with the first lead interposed between the second lead and the third lead, wherein the first lead, the second lead, and the third lead are held by resin, and the second lead has an inner lead longer than the inner lead of the third lead.

Further, the semiconductor element has an asymmetric temperature distribution during an operation, and the semiconductor element has a high-temperature region side on a third lead side of the mounting part for mounting the semiconductor element.

Moreover, the semiconductor element and the first, second, and third leads are connected via wires, and the joint of the semiconductor element and the first lead is disposed on the third lead side of the mounting part for mounting the semiconductor element.

Further, the semiconductor device further includes an inlet for the resin on the second lead and on the opposite side from a surface for mounting the semiconductor element on the mounting part.

Moreover, the semiconductor element is a semiconductor laser element.

Further, the semiconductor element is a dual-wavelength semiconductor laser element and has a short wavelength output at a red wavelength of 650 nm band and a long wavelength output at an infrared wavelength of 800 nm band, and the dual-wavelength semiconductor laser element is mounted so as to have a short wavelength output side on the third lead side of the mounting part.

DESCRIPTION OF THE EMBODIMENTS

In a semiconductor device of the present invention, a semiconductor element such as a dual-wavelength semiconductor laser element has an asymmetric temperature distribution during an operation is mounted on a semiconductor element mounting part of a lead frame and is molded with resin. The lead frame has a first lead connected to the semiconductor element mounting part and second and third leads which are respectively adjacent to both sides of the first lead and are electrically isolated. The second and third leads include inner leads having different lengths, so that the size of the semiconductor element mounting part is bilaterally asymmetric. Moreover, a feature of the semiconductor device of the present invention is that the semiconductor element is mounted on the semiconductor element mounting part so as to have a high-temperature region side in a region where the shorter inner lead is provided and the semiconductor element mounting part is large, and the semiconductor element is wire bonded to the first lead in the region where the semiconductor element mounting part is large.

As has been discussed, in the semiconductor device where the semiconductor element having an asymmetric temperature distribution during an operation is mounted, the inner leads on the right and left ends have asymmetric lengths, so that the right and left regions of the semiconductor element mounting part have different sizes. The semiconductor element is mounted so as to have the high-temperature region side in the wide region of the mounting part, and the inner leads are wire bonded at the center to the wide region of the mounting part. It is thus possible to provide a small semiconductor device in which a long semiconductor element is mounted with heat dissipation.

As an embodiment of the semiconductor device of the present invention, a semiconductor laser apparatus having a dual-wavelength semiconductor laser element mounted therein will be described below in accordance with the accompanying drawings.

Figure 1A:
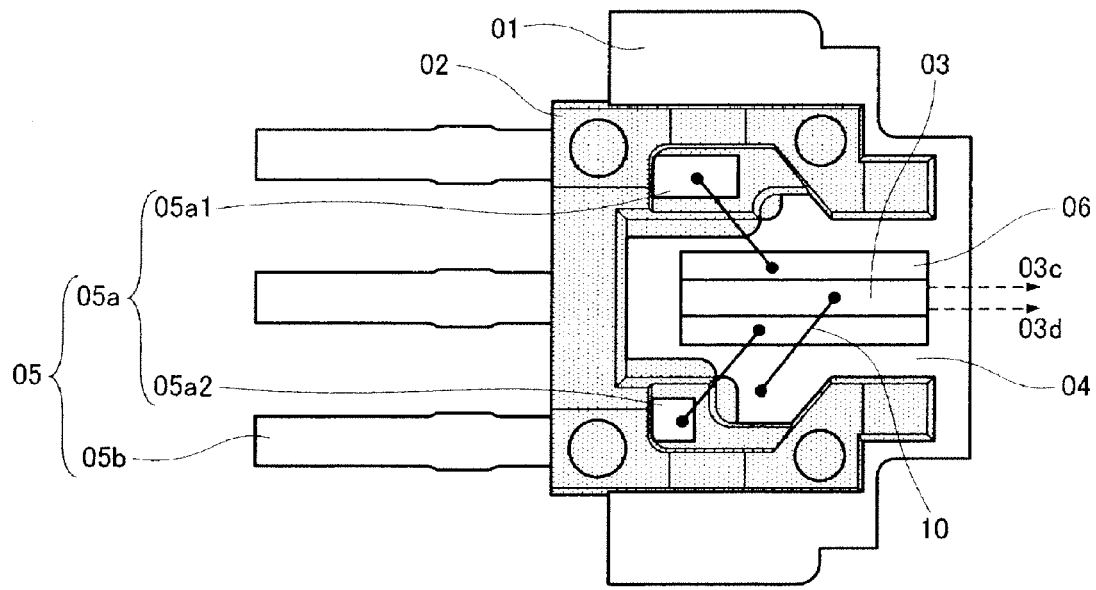
FIG. 1A is a schematic diagram showing a semiconductor laser apparatus of the present invention.
Figure 1B:
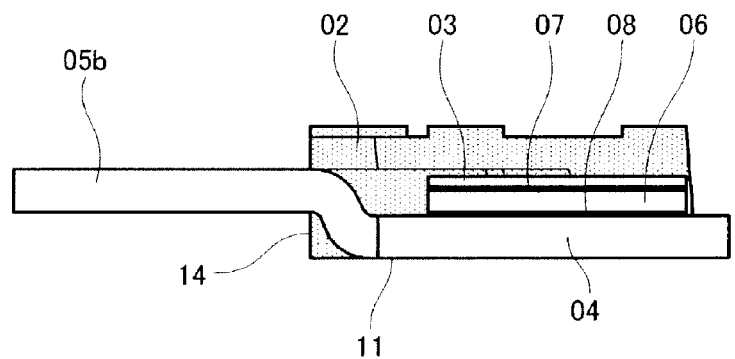
FIG. 1B is a schematic diagram showing the semiconductor laser apparatus of the present invention.
Figure 1C:
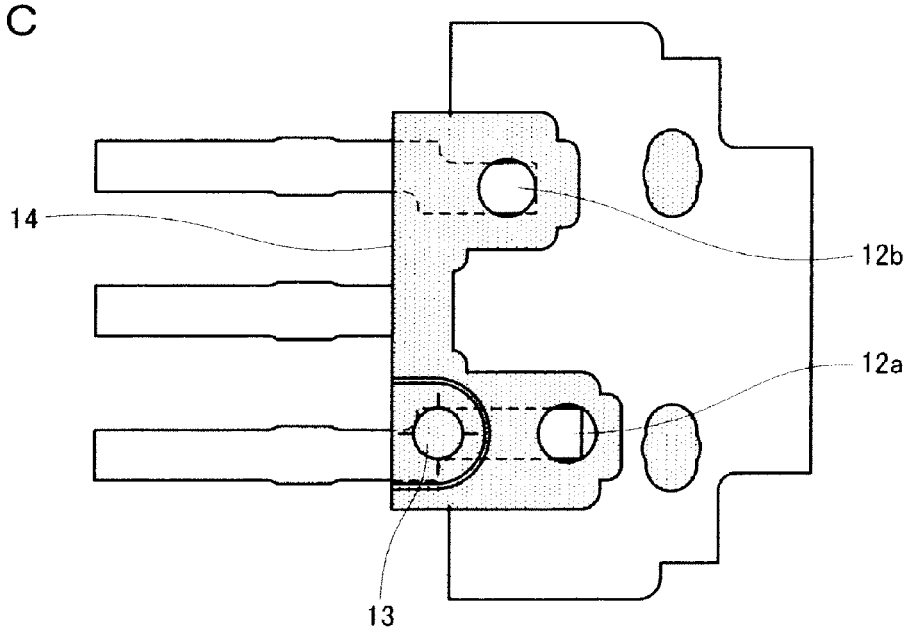
FIG. 1C is a schematic diagram showing the semiconductor laser apparatus of the present invention.
Figure 2:
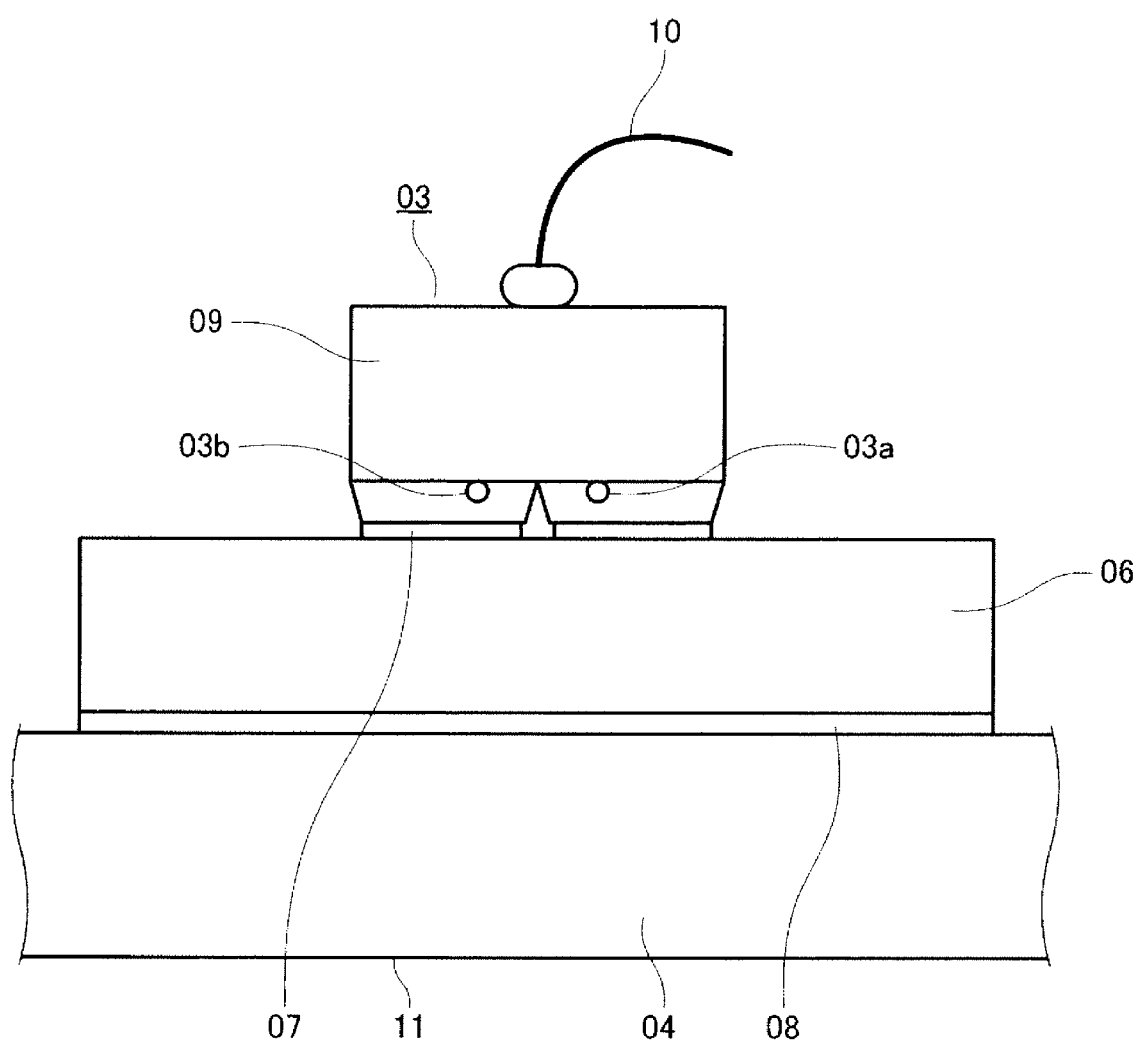
FIG. 2 is a schematic diagram showing an emission end face of the semiconductor laser apparatus of the present invention.
Figure 3A:
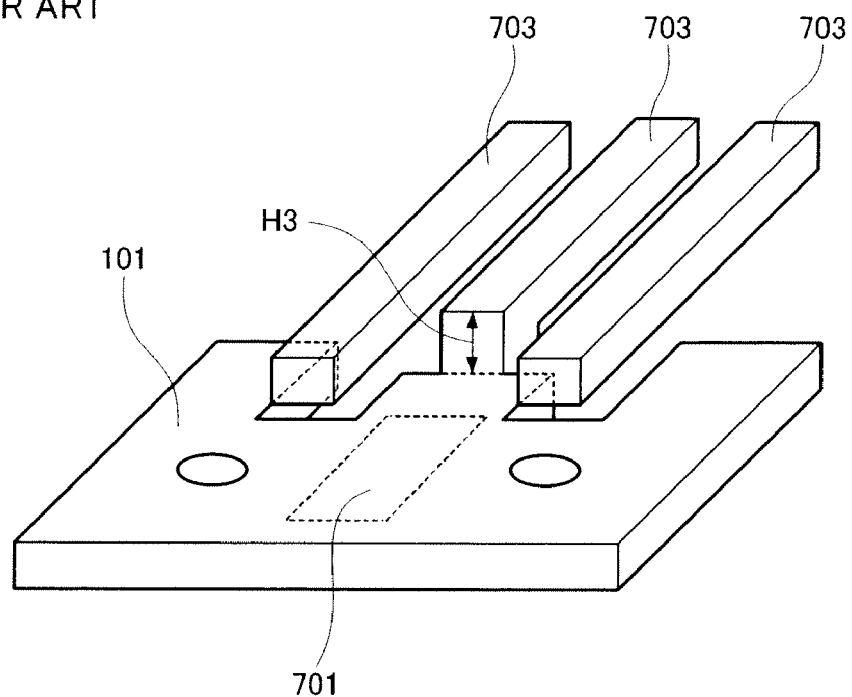
FIG. 3A is a schematic diagram showing a semiconductor laser apparatus of the prior art.
Figure 3B:
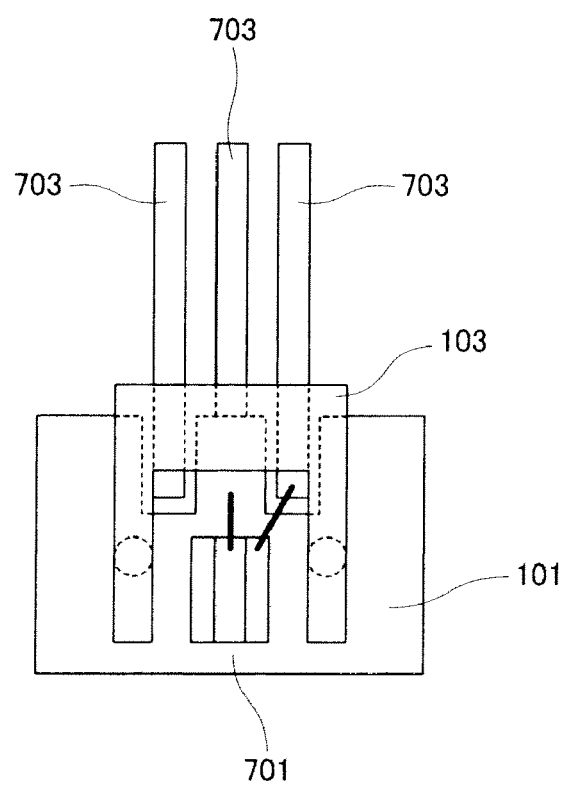
FIG. 3B is a schematic diagram showing the semiconductor laser apparatus of the prior art.

FIGS. 1A, 1B and 1C are schematic diagrams of the semiconductor laser apparatus of the present invention. FIG. 1A is a surface diagram, FIG. 1B is a sectional view, and FIG. 1C is a back view. FIG. 2 is a schematic diagram showing an emission end face of the semiconductor laser apparatus of the present invention.

As shown in FIGS. 1A, 1B, 1C and 2, the semiconductor laser apparatus of the present invention includes resin 02 molded by resin molding on a conductive metal frame 01. The metal frame 01 has a mounting part 04 for a semiconductor laser element 03 surrounded by the resin 02, and leads 05 including inner leads 05a disposed inside the resin 02 and outer leads 05b disposed outside the resin 02. The leads 05 include the lead acting as a terminal for a cathode formed to be electrically connected at the center to the metal frame 01 and the two leads acting as terminals for anodes which are formed on both sides of the terminal for a cathode separately from the metal frame 01 and are fixed on the metal frame 01 with the resin 02. The inner leads 05a include a first inner lead 05a1 and a second inner lead 05a2 which have different lengths on the right and left. The first inner lead 05a1 is longer than the second inner lead 05a2.

The metal frame 01 and the leads 05 are made of copper and the material of resin is a liquid crystal polymer (LCP).

The semiconductor laser element 03 is mounted on the mounting part 04 via a sub mount 06. The semiconductor laser element 03 and the sub mount 06 are joined with a solder material 07, and the sub mount 06 and the mounting part 04 of the metal frame 01 are joined with a conductive material 08. The sub mount 06 is made of aluminum nitride, the solder material is AuSn solder, and the conductive material 08 is silver paste.

The semiconductor laser element 03 has a first light-emitting point 03a and a second light-emitting point 03b. The first light-emitting point 03a is a light emitting point on an infrared wavelength side of 800 nm band and the second light-emitting point 03b is a light emitting point on a red wavelength side of 680 nm band. A first optical axis 03c from the first light-emitting point 03a and a second optical axis 03d from the second light-emitting point 03b are emitted in parallel with each other.

The mounting part 04 of the metal frame is bilaterally asymmetric relative to the first optical axis 03c and the second optical axis 03d. The mounting part 04 is formed so as to have a small area on the infrared wavelength side that is the side of the first light-emitting point 03a and a large area on the red wavelength side that is the side of the second light-emitting point 03b. On the red wavelength side of 650 nm band of the semiconductor laser element, a material has a narrow band gap and an operating current increases and an optical output decreases in a high temperature operation. Thus heat dissipation has to be improved. The red wavelength side of 650 nm band is disposed on the large area side of the mounting part 04, achieving heat dissipation with high efficiency through a large metal surface. Thus a light emitting operation can be performed at a higher temperature.

The mounted semiconductor laser element is a dual-wavelength high-power semiconductor laser element. The semiconductor laser element is joined to a semiconductor substrate 09 such that a light-emitting point epitaxial growth layer is joined to the sub mount. On the cathode side of the semiconductor laser element, a single wire 10 for the cathode is wire bonded to be shared on the semiconductor substrate 09.

On a mounting surface for the semiconductor laser element 03 on the mounting part 04 of the metal frame 01, the cathode wire of the semiconductor laser element is bonded to the wide region of the mounting part. Further, the anode on the red wavelength side is connected by wire bonding to the second inner lead 05a2, and the anode on the infrared wavelength side is connected by wire bonding to the first inner lead 05a1.

By bonding the cathode wire 10 to the large area side of the mounting part 04, it is possible to eliminate the necessity for bonding the wire to the rear end of the semiconductor laser element having a long cavity length when the semiconductor laser element is mounted, thereby suppressing an increase in the size of the semiconductor laser apparatus in a cavity direction.

On an underside 11 of the semiconductor laser apparatus, the outer leads 05b are molded with resin with a height from the mounting part 04. Since pins are disposed for holding the outer leads during resin molding, a first holding pin hole 12a and a second holding pin hole 12b are formed which are not filled with resin. Moreover, on the infrared wavelength side that is the small area side of the mounting part 04, a resin inlet 13 for molding resin is formed. The inner leads 05a, the outer leads 05b, and the mounting part 04 are asymmetric which are formed by punching and bending from the metal frame. Thus the first inner lead 05a1 is long on the small area side of the mounting part 04 and conversely the second inner lead 05a2 is short on the large area side of the mounting part 04, so that the leads have asymmetric lengths. On the underside 11 of the semiconductor laser apparatus, the resin inlet 13 is disposed closely to a rear end 14 of the semiconductor laser apparatus on the side of the first inner lead 05a1 longer than the second inner lead 05a2. Since the first inner lead 05a1 is long, the resin inlet 13 and the first holding pin hole 12a can be disposed on the inner lead. It is thus possible to simultaneously hold the inner lead and inject the resin during molding. The short second inner lead 05a2 can be fixed by disposing the second holding pin hole 12b during molding.

The foregoing explanation described an example in which the semiconductor laser element for outputting an infrared wavelength of 800 nm band and a red wavelength of 680 nm band is mounted as a dual-wavelength semiconductor laser element. The output wavelength is not particularly limited and the dual-wavelength semiconductor laser element may output laser at different wavelengths.

As has been discussed, the inner leads on the right and left ends have asymmetric lengths in the dual-wavelength semiconductor laser apparatus having the three terminals, so that the right and left regions of the semiconductor laser element mounting part have different sizes. Further, the semiconductor laser element is mounted such that the short-wavelength output side of the semiconductor laser element having a small high-temperature operation margin is disposed in the wide region of the mounting part, thereby improving heat dissipation efficiency. Moreover, the cathode is wire bonded to the wide region of the mounting part, so that it is possible to eliminate the necessity for providing a bonding region in the direction of the cavity length and thus reduce the size of the semiconductor laser apparatus. Further, the resin inlet is provided on the long inner lead, so that it is possible to easily form the resin while suppressing an increase in the size of the semiconductor laser apparatus. In the embodiment, the length of the semiconductor laser apparatus other than the outer lead is about 3.75 mm in the cavity direction and the width of the mold resin is about 3.5 mm in a direction orthogonal to the cavity direction.

The metal frame and the leads may be made of a material such as iron used for a semiconductor lead frame, instead of copper. The mold resin may be a resin such as polyphenylene sulfide (PPS) in addition to a liquid crystal polymer (LCP). Further, the resin may contain a filler and glass fiber to increase a strength and thermal resistance.

The sub mount may be made of a material such as silicon and silicon carbide instead of aluminum nitride, or a material generally used for a sub mount of a semiconductor laser apparatus.

The solder material may be AuAg, AuSi, AuGe, Sn, InAg, and so on instead of AuSn solder. A generally used solder material may be used.

The faying surfaces of the sub mount and the metal frame may be plated with Au and so on instead of silver paste used as a conductive material, and may be joined with a solder material such as AuSn.

The region where the semiconductor laser element is mounted on the metal frame has the same thickness as the outer leads but the region does not always have to have the same thickness. Since the region has the same thickness as the outer leads, only bending and punching are necessary on the metal lead frame and a process of partial rolling and the like is not necessary.

What is claimed is:

1. A semiconductor device comprising:
   a semiconductor element (03) having an asymmetric temperature distribution including a higher temperature side and a lower temperature side during operation, and;
   a lead frame (01) comprising:
   a mounting part (04) for mounting the semiconductor element;
   a first lead connected to the mounting part;
   a second lead adjacent to the first lead;
   a third lead adjacent to the first lead;
   wherein the first lead is between the second lead and the third lead, said first, second and third leads being held in their positions by resin;
   the second lead has an inner lead (05a1) longer than an inner lead (05a2) of the third lead, and
   the semiconductor element is mounted on the lead frame with its higher temperature side closer than the lower temperature side to the third lead for improved dissipation of heat originating from the higher temperature side of the semiconductor element.

2. The semiconductor device according to claim 1, wherein the semiconductor element and the first, second, and third leads are connected via wires, and the first lead joins the semiconductor element on the third lead side of the mounting part for mounting the semiconductor element.

3. The semiconductor device according to claim 1, further comprising an inlet for resin on the second lead and on an opposite side from a surface for mounting the semiconductor element on the mounting part.

4. The semiconductor device according to claim 1, wherein the semiconductor element is a semiconductor laser element.

5. The semiconductor device according to claim 2, wherein the semiconductor element is a semiconductor laser element.

6. The semiconductor device according to claim 3, wherein the semiconductor element is a semiconductor laser element.

7. The semiconductor device according to claim 1, wherein the semiconductor element is a dual-wavelength semiconductor laser element and has a short wavelength output at a red wavelength of 650 nm band and a long wavelength output at an infrared wavelength of 800 nm band, and the dual-wavelength semiconductor laser element is mounted so as to have a short wavelength output side on the third lead side of the mounting part.

8. The semiconductor device according to claim 2, wherein the semiconductor element is a dual-wavelength semiconductor laser element and has a short wavelength output at a red wavelength of 650 nm band and a long wavelength output at an infrared wavelength of 800 nm band, and the dual-wavelength semiconductor laser element is mounted so as to have a short wavelength output side on the third lead side of the mounting part.

9. The semiconductor device according to claim 3, wherein the semiconductor element is a dual-wavelength semiconductor laser element and has a short wavelength output at a red wavelength of 650 nm band and a long wavelength output at an infrared wavelength of 800 nm band, and the dual-wavelength semiconductor laser element is mounted so as to have a short wavelength output side on a third lead side of the mounting part.

* * * * *